(12) United States Patent
Utsumi et al.

(10) Patent No.: US 11,315,842 B2
(45) Date of Patent: Apr. 26, 2022

(54) SEMICONDUCTOR PACKAGE

(71) Applicant: Mitsubishi Electric Corporation, Tokyo (JP)

(72) Inventors: Hiromitsu Utsumi, Tokyo (JP); Hiroaki Minamide, Tokyo (JP); Suguru Maki, Tokyo (JP); Katsumi Miyawaki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 13 days.

(21) Appl. No.: 16/755,519

(22) PCT Filed: Jan. 22, 2018

(86) PCT No.: PCT/JP2018/001746
§ 371 (c)(1),
(2) Date: Apr. 10, 2020

(87) PCT Pub. No.: WO2019/142349
PCT Pub. Date: Jul. 25, 2019

(65) Prior Publication Data
US 2021/0225717 A1 Jul. 22, 2021

(51) Int. Cl.
*H01L 23/10* (2006.01)
*H01L 23/047* (2006.01)
(Continued)

(52) U.S. Cl.
CPC ............ *H01L 23/10* (2013.01); *H01L 23/047* (2013.01); *H01L 23/32* (2013.01); *H01L 23/66* (2013.01);
(Continued)

(58) Field of Classification Search
CPC .................. H01L 2924/161–16798; H01L 2924/171–17798; H01L 23/10; H01L 23/32
See application file for complete search history.

(56) References Cited

U.S. PATENT DOCUMENTS 4,985,753 A * 1/1991 Fujioka ................. H01L 23/057
257/700
5,926,371 A * 7/1999 Dolbear ............... H05K 1/0204
361/704
(Continued)

FOREIGN PATENT DOCUMENTS

| JP | 2000200865 A | 7/2000 |
| JP | 2008053588 A | 3/2008 |
(Continued)

OTHER PUBLICATIONS

International Search Report; Written Opinion; and Notification of Transmittal of The International Search Report and the Written Opinion of the International Searching Authority, or the Declaration issued in PCT/JP2018/001746; dated Mar. 27, 2018.

*Primary Examiner* — Tucker J Wright
(74) *Attorney, Agent, or Firm* — Studebaker & Brackett PC (57) ABSTRACT

A transistor (2) and a matching circuit substrate (3-6) are provided on a base plate (1) and connected to each other. A frame (15) is provided on the base plate (1) and surrounds the transistor (2) and the matching circuit substrate (3-6). The frame (15) has a smaller linear expansion coefficient than that of the base plate (1). A screwing portion (17) is provided in the frame (15). A size of the base plate (1) is smaller than that of the frame (15).

6 Claims, 7 Drawing Sheets

(51) Int. Cl.
*H01L 23/66* (2006.01)
*H01L 23/32* (2006.01)
(52) U.S. Cl.
CPC ............... *H01L 2223/6655* (2013.01); *H01L 2924/172* (2013.01); *H01L 2924/176* (2013.01)

(56) References Cited

U.S. PATENT DOCUMENTS

2011/0186983 A1\* 8/2011 Hasegawa ........... H01L 23/3736
257/698
2012/0161309 A1 6/2012 Utsumi

FOREIGN PATENT DOCUMENTS

| JP | 2010027953 A | 2/2010 |
| JP | 2012142371 A | 7/2012 |
| JP | 2014049726 A | 3/2014 |

\* cited by examiner

DISPLACEMENT IN
Z-DIRECTION [mm]

SEMICONDUCTOR PACKAGE

FIELD

The present disclosure relates to a semiconductor package.

BACKGROUND

In a semiconductor amplifier used in a microwave band, a semiconductor package for a transistor of a high-power internal matching circuit type is used. Conventionally, the semiconductor package has been mounted in a housing of the semiconductor amplifier by making a threaded connection at a screwing portion of a base plate of the semiconductor package (e.g., see Patent Literature 1).

CITATION LIST

Patent Literature

[PTL 1] JP 2014-049726 A

SUMMARY

Technical Problem

In order to provide the screwing portion, it has hitherto been necessary to increase the size of the base plate. However, the base plate has a larger linear expansion coefficient than other members such as a matching circuit substrate or a transistor to be mounted. Due to the difference in linear expansion coefficient, the semiconductor package may warp in high-temperature treatment at the time of mounting or packaging these members. Accordingly, the problem has been that, when the semiconductor package is mounted into the housing of the semiconductor amplifier, a gap is generated between the lower surface of the base plate and the housing to change a path from the transistor to the housing which serves as a ground, thus causing decreases in high-frequency characteristics and reliability.

An object of the present invention, which has been made to solve the problem as thus described, is to obtain a semiconductor package capable of improving the high-frequency characteristics and reliability.

Solution to Problem

A semiconductor package according to the present disclosure includes: a base plate; a transistor and a matching circuit substrate which are provided on the base plate and connected to each other; and a frame provided on the base plate and surrounding the transistor and the matching circuit substrate, wherein the frame has a smaller linear expansion coefficient than that of the base plate, a screwing portion is provided in the frame, and a size of the base plate is smaller than that of the frame.

Advantageous Effects of Invention

In the present disclosure, the size of the frame having a small linear expansion coefficient is increased and the screwing portion is provided in the frame. This eliminates the need to provide the screwing portion in the base plate, and hence the size of the base plate having a large linear expansion coefficient can be made smaller than that of the frame. It is thereby possible to prevent the warpage of the base plate after the matching circuit substrates and the transistor have been mounted. Therefore, the adhesion between the lower surface of the base plate and the housing of the semiconductor amplifier increases to enable the grounding, so that it is possible to improve the high-frequency characteristics and reliability.

DESCRIPTION OF EMBODIMENTS

A semiconductor package according to the embodiments of the present disclosure will be described with reference to the drawings. The same components will be denoted by the same symbols, and the repeated description thereof may be omitted.

First Embodiment

Figure 1:
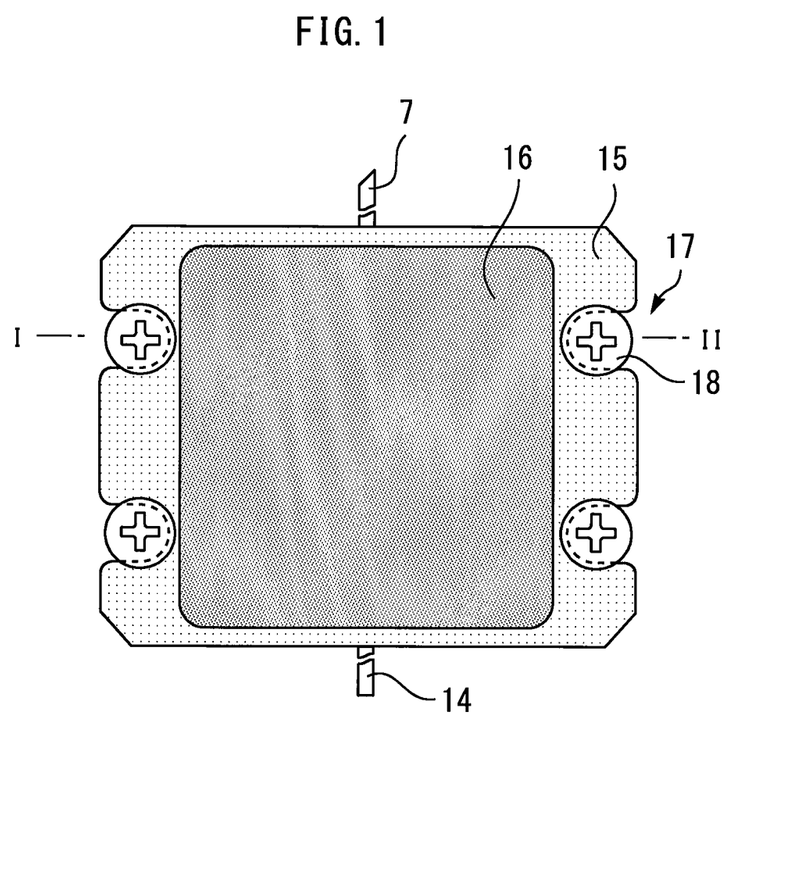
FIG. 1 is a top view illustrating a semiconductor package according to a first embodiment.
Figure 2:
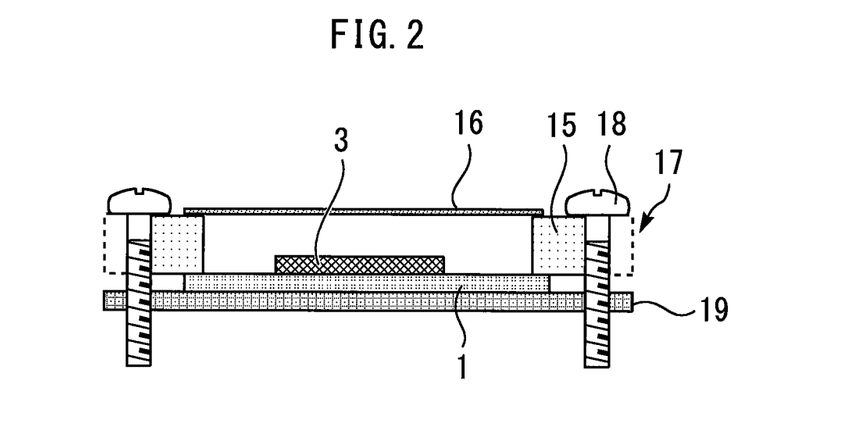
FIG. 2 is a cross-sectional view along I-II of FIG. 1.
Figure 3:
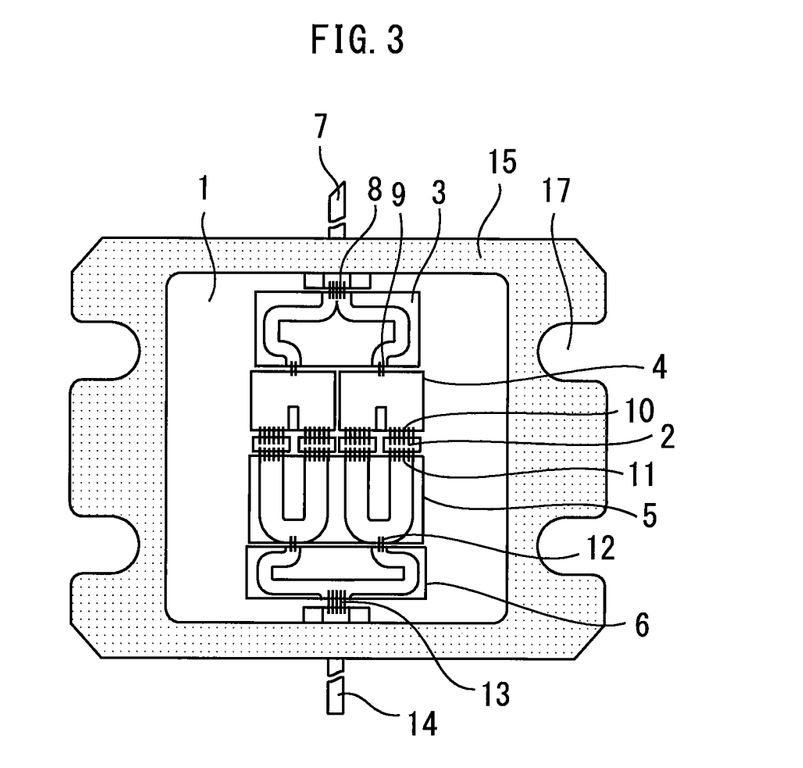
FIG. 3 is a top view illustrating the inside of the semiconductor package according to the first embodiment.

FIG. 1 is a top view illustrating a semiconductor package according to a first embodiment. FIG. 2 is a cross-sectional view along I-II of FIG. 1. FIG. 3 is a top view illustrating the inside of the semiconductor package according to the first embodiment. This semiconductor package is a transistor of a high-power internal matching circuit type.

A transistor 2 and a matching circuit substrates 3 to 6 are provided on a base plate 1. An input lead terminal 7 is connected to wiring of the matching circuit substrate 3 with an Au wire 8. The wiring of the matching circuit substrate 3 and the wiring of the matching circuit substrate 4 are connected with an Au wire 9. The wiring of the matching circuit substrate 4 is connected to a control electrode of the transistor 2 with an Au wire 10. A lower electrode of the transistor 2 is connected to the base plate 1. An upper electrode of the transistor 2 is connected to wiring of the matching circuit substrate 5 with an Au wire 11. The wiring of the matching circuit substrate 5 and the wiring of the matching circuit substrate 6 are connected with an Au wire 12. The wiring of the matching circuit substrate 6 is connected to an output lead terminal 14 with an Au wire 13.

A frame 15 is provided on the base plate 1, surrounding the transistor 2 and the matching circuit substrates 3 to 6. A cap 16 is provided on the frame 15, covering the transistor 2 and the matching circuit substrates 3 to 6 from above. The base plate 1 is made of CuMo having a linear expansion coefficient of 9.1 [10−6/K]. The frame 15 and the cap 16 are made of Kovar having a linear expansion coefficient of 5.2 [10−6/K]. Therefore, the frame 15 and the cap 16 have a smaller linear expansion coefficient than that of the base plate 1.

Screwing portions 17 are provided in the frame 15. The screwing portions 17 are notches, two each of which is provided on each of two opposing sides of the frame 15. A screw 18 is passed through the screwing portion 17 to threadedly secure the semiconductor package onto a housing 19 of the semiconductor amplifier.

Figure 4:
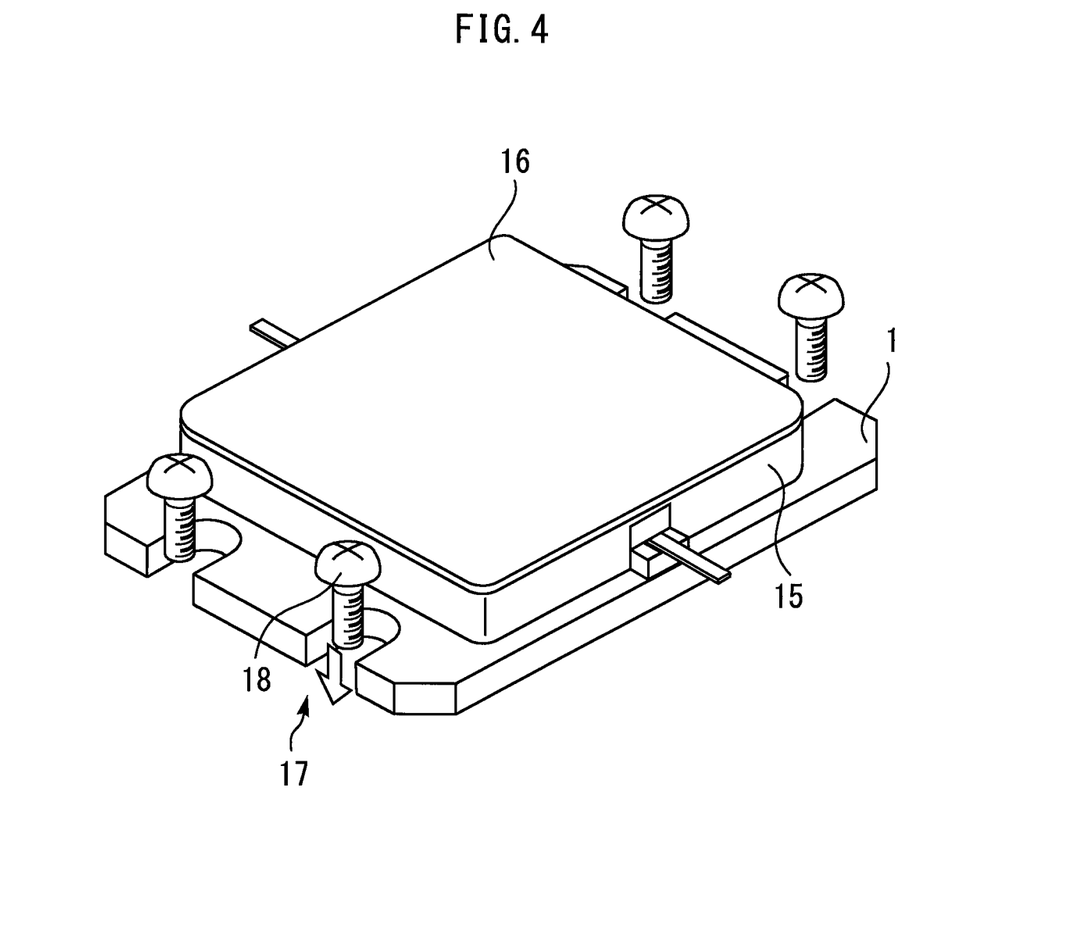
FIG. 4 is a perspective view illustrating a semiconductor package according to the comparative example.
Figure 5:
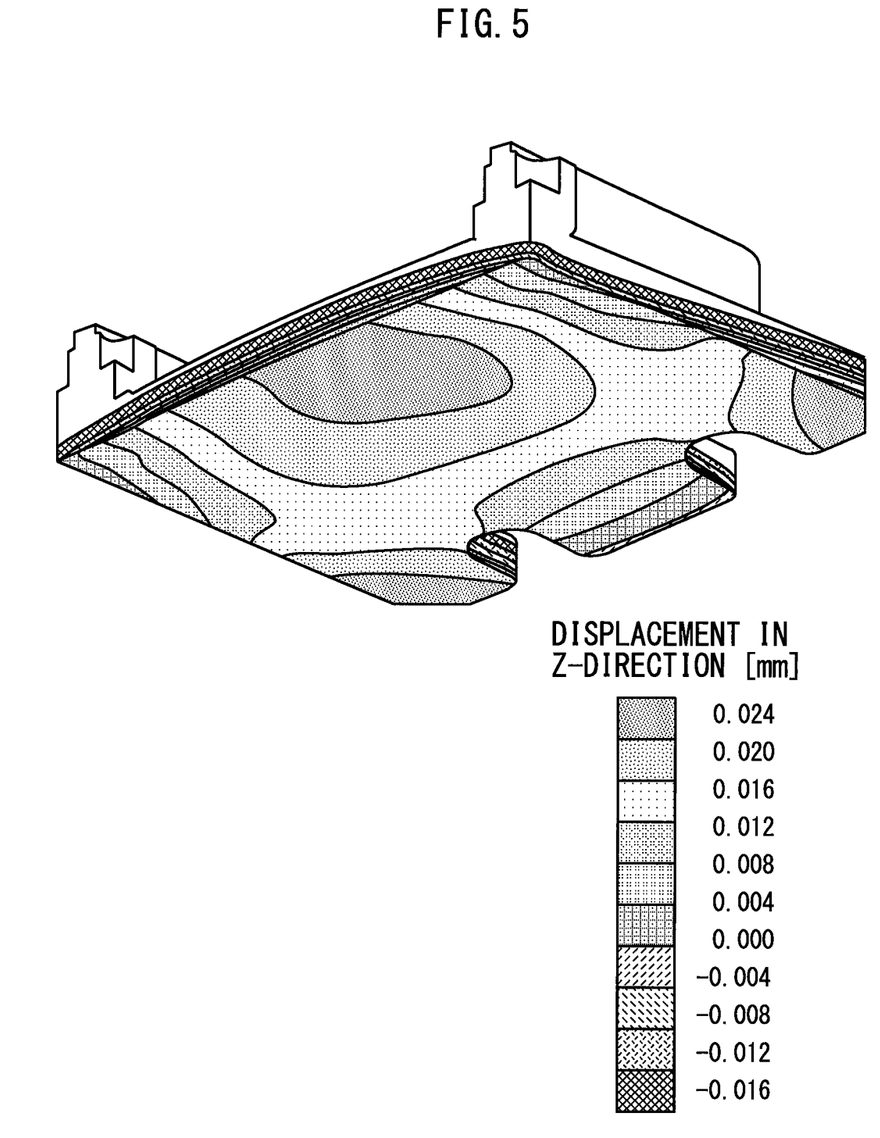
FIG. 5 is a perspective view illustrating the displacement in the Z-direction of the back surface of the semiconductor package according to the comparative example.
Figure 6:
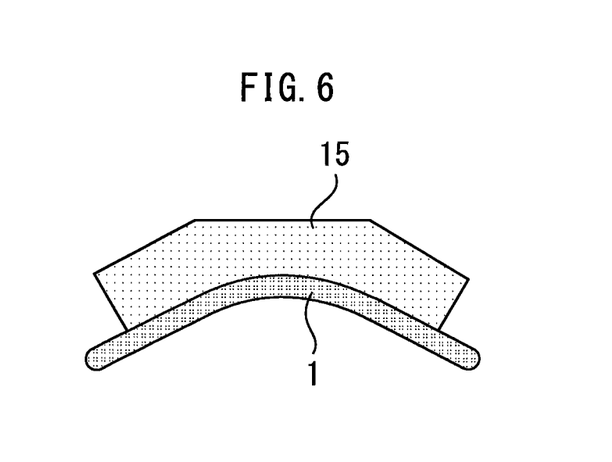
FIG. 6 is a side view of the semiconductor package according to the comparative example.

Subsequently, the effect of the present embodiment will be described in comparison with a comparative example. FIG. 4 is a perspective view illustrating a semiconductor package according to the comparative example. FIG. 5 is a perspective view illustrating the displacement in the Z-direction of the back surface of the semiconductor package according to the comparative example. FIG. 6 is a side view of the semiconductor package according to the comparative example. In the comparative example, for providing the screwing portion 17 in the base plate 1 of the semiconductor package, it is necessary to increase the size of the base plate 1 having a large linear expansion coefficient. Hence warpage occurs in the semiconductor package, so that when the semiconductor package is mounted into the housing 19 of the semiconductor amplifier, a gap is generated between the lower surface of the base plate 1 and the housing 19 to change a path from the transistor 2 to the housing 19 which serves as a ground, thus causing decreases in high-frequency characteristics and reliability.

In contrast, in the present embodiment, the size of the frame 15 having a small linear expansion coefficient is increased and the screwing portion 17 is provided in the frame 15. This eliminates the need to provide the screwing portion 17 in the base plate 1, and hence the size of the base plate 1 having a large linear expansion coefficient can be made smaller than that of the frame 15. It is thereby possible to prevent the warpage of the base plate 1 after the matching circuit substrates 3 to 6 and the transistor 2 have been mounted. Therefore, the adhesion between the lower surface of the base plate 1 and the housing 19 of the semiconductor amplifier increases to enable the grounding, so that it is possible to improve the high-frequency characteristics and reliability. Further, since the frame 15 above the base plate 1 is threadedly secured onto the housing 19 of the semiconductor amplifier, a corrective force for the warpage of the base plate 1 is larger than the case in which the base plate 1 is threadedly secured.

Second Embodiment

Figure 7:
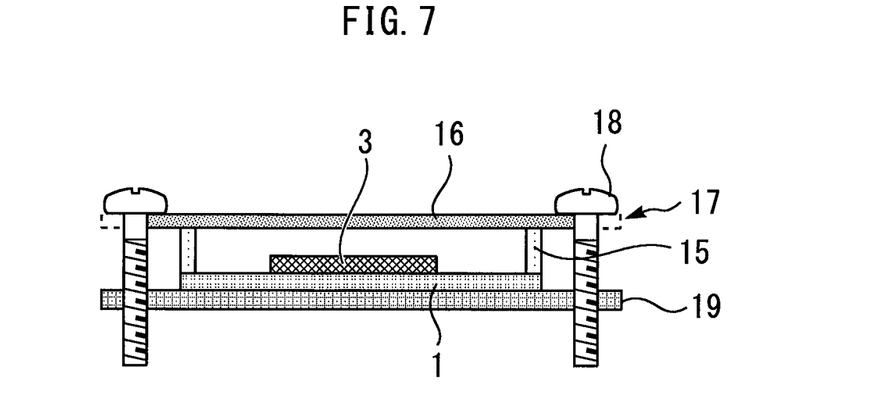
FIG. 7 is a cross-sectional view illustrating a semiconductor package according to a second embodiment.

FIG. 7 is a cross-sectional view illustrating a semiconductor package according to a second embodiment. In the present embodiment, the size of the cap 16 is increased, and the screwing portion 17 is provided. Then, the size of the base plate 1 having a large linear expansion coefficient is made smaller than that of the cap 16. It is thereby possible to prevent the warpage of the base plate 1. Therefore, the adhesion between the lower surface of the base plate 1 and the housing 19 of the semiconductor amplifier increases to enable the grounding, so that it is possible to improve the high-frequency characteristics and reliability. Further, since the cap 16 above the base plate 1 is threadedly secured onto the housing 19 of the semiconductor amplifier, a corrective force for the warpage of the base plate 1 is larger than the case in which the base plate 1 is threadedly secured.

Third Embodiment

Figure 8:
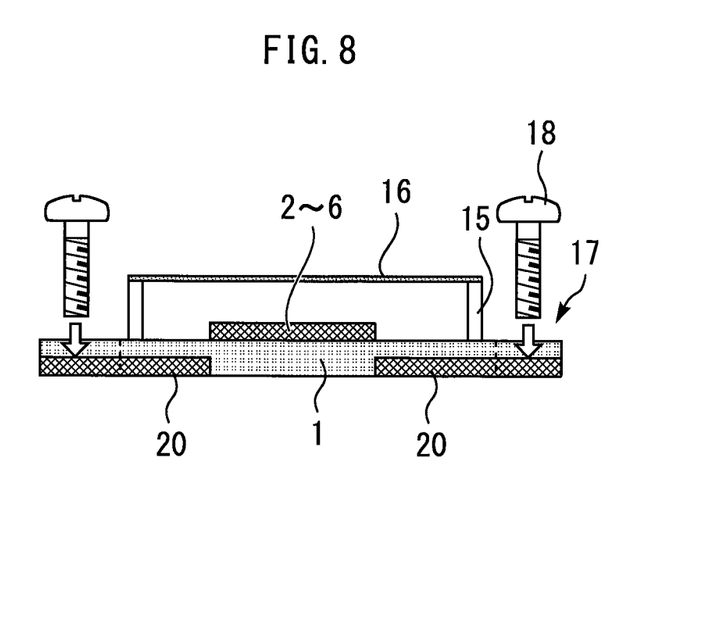
FIG. 8 is a cross-sectional view illustrating a semiconductor package according to a third embodiment.

FIG. 8 is a cross-sectional view illustrating a semiconductor package according to a third embodiment. The screwing portion 17 is provided in the base plate 1 in the present embodiment. A ceramic substrate 20 is embedded in a groove provided on the lower surface of the base plate 1. The ceramic substrate 20 has the same material quality (i.e., linear expansion coefficient), thickness, and size as those of the matching circuit substrates 3 to 6. It is thereby possible to prevent the warpage of the base plate 1. Therefore, the adhesion between the lower surface of the base plate 1 and the housing 19 of the semiconductor amplifier increases to enable the grounding, so that it is possible to improve the high-frequency characteristics and reliability. However, the ceramic substrate 20 with larger thermal resistance than that of the base plate 1 is not disposed directly below the transistor 2 so as to maintain the thermal dissipation of the transistor 2.

Fourth Embodiment

Figure 9:
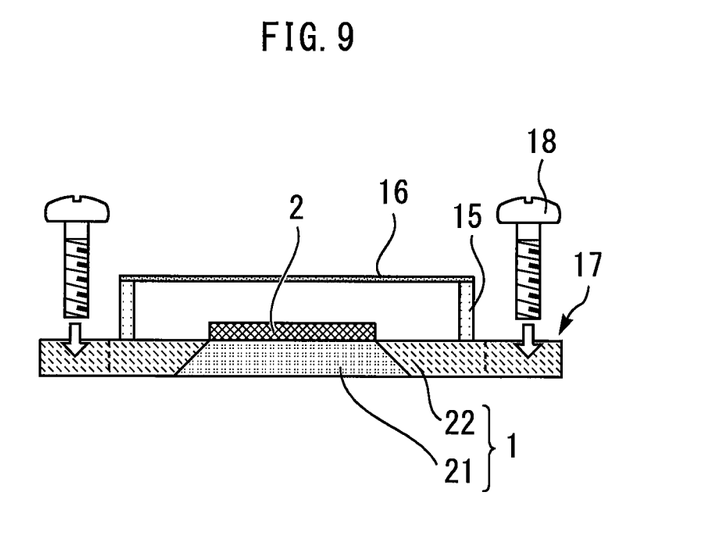
FIG. 9 is a cross-sectional view illustrating a semiconductor package according to a fourth embodiment.
Figure 10:
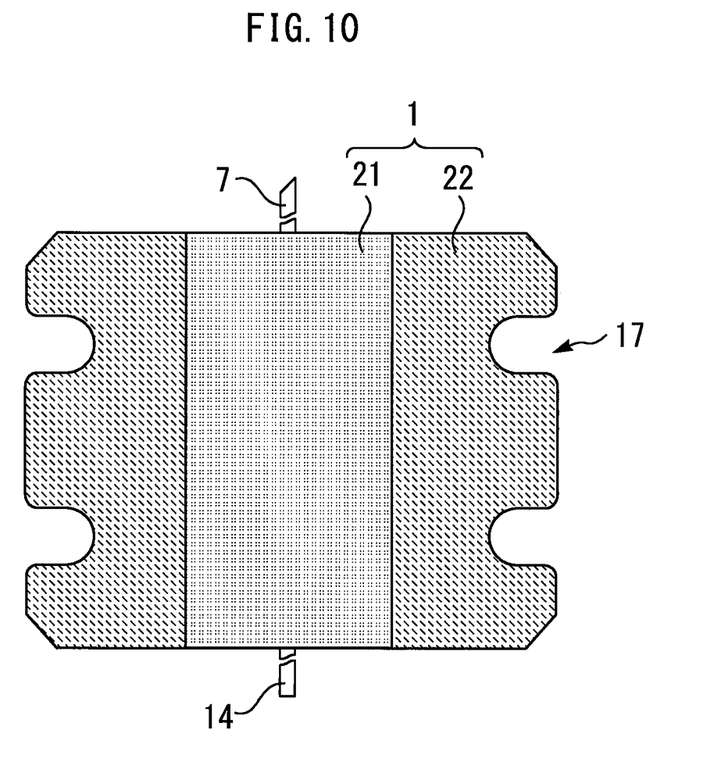
FIG. 10 is a bottom view illustrating the semiconductor package according to the fourth embodiment.

FIG. 9 is a cross-sectional view illustrating a semiconductor package according to a fourth embodiment. FIG. 10 is a bottom view illustrating the semiconductor package according to the fourth embodiment. The screwing portion 17 is provided in the base plate 1 in the present embodiment. The base plate 1 includes a first metal 21 made of CuMo and disposed directly below the transistor 2, and a second metal 22 made of molybdenum or the like having a smaller linear expansion coefficient and larger thermal resistance than those of the first metal 21.

By incorporating the second metal 22 having a small linear expansion coefficient into the base plate 1, it is possible to prevent the warpage of the base plate 1. Therefore, the adhesion between the lower surface of the base plate 1 and the housing 19 of the semiconductor amplifier increases to enable the grounding, so that it is possible to improve the high-frequency characteristics and reliability.

Further, the thermal dissipation is ensured by placing the first metal 21 with small thermal resistance directly below the transistor 2. Specifically, the heat of the transistor 2 is diffused through a region that spreads at an angle of 45 degrees from the lower surface of the transistor 2 to the lower surface of the base plate 1. Hence the second metal 22 with a small linear expansion coefficient is not provided in a region where the thermal resistance is affected but provided in a region where the thermal resistance is not affected.

REFERENCE SIGNS LIST 1 base plate; 2 transistor; 3 to 6 matching circuit substrate; 15 frame; 16 cap; 17 screwing portion; 20 ceramic substrate; 21 first metal; 22 second metal

The invention claimed is:
1. A semiconductor package comprising:
   a base plate;
   a transistor and a matching circuit substrate which are provided on the base plate and connected to each other; and
   a frame provided on the base plate and surrounding the transistor and the matching circuit substrate,
   wherein the frame is a single integral piece and has a smaller linear expansion coefficient than that of the base plate,
   a screwing portion is provided in the frame, and
   a size of the base plate is smaller than that of the frame.
2. The semiconductor package according to claim 1, wherein
   the screwing portion is provided in the frame such that a screw passing through the screwing portion to thread- edly secure the semiconductor package directly engages with an upper surface of the frame so as to provide a downward force on the upper surface of the frame.

3. The semiconductor package according to claim 1, wherein
the screwing portion provided in the frame is spaced from the base plate in a plan view.

4. The semiconductor package according to claim 1, wherein
the transistor is provided on an upper surface of the base plate, and
the screwing portion provided in the frame is positioned above the base plate.

5. The semiconductor package according to claim 1, wherein
the transistor and the matching circuit substrate are provided on a largest surface of the base plate, and
the frame is provided on the largest surface.

6. The semiconductor package according to claim 1, wherein
the transistor and the matching circuit substrate are provided on an upper surface of the base plate, and
the frame surrounds the transistor and the matching circuit substrate in a plane parallel with a plane of the upper surface.

* * * * *